United States Patent [19]

Khan et al.

[11] Patent Number: 4,951,050
[45] Date of Patent: Aug. 21, 1990

[54] 2:1 VOLTAGE MATRIX ENCODED I/O TRANSMISSION SYSTEM

[75] Inventors: Aurangzeb K. Khan, San Bruno; Lordson L. Yue, Sunnyvale, both of Calif.

[73] Assignee: Tandem Computers Incorporated, Cupertino, Calif.

[21] Appl. No.: 268,422

[22] Filed: Nov. 8, 1988

[51] Int. Cl.[5] .......................................... H03K 13/24
[52] U.S. Cl. ..................................................... 341/73
[58] Field of Search ...................... 341/50, 73, 79, 110

[56] References Cited

U.S. PATENT DOCUMENTS 4,556,868  12/1985  Harle .................................... 341/73

Primary Examiner—William M. Shoop, Jr.
Assistant Examiner—Sharon D. Logan
Attorney, Agent, or Firm—Townsend and Townsend

[57] ABSTRACT

Encoding and decoding circuits, utilizing high speed ECL-like logic, simultaneously transmit and receive multiple binary signals via a single I/O pin.

5 Claims, 3 Drawing Sheets

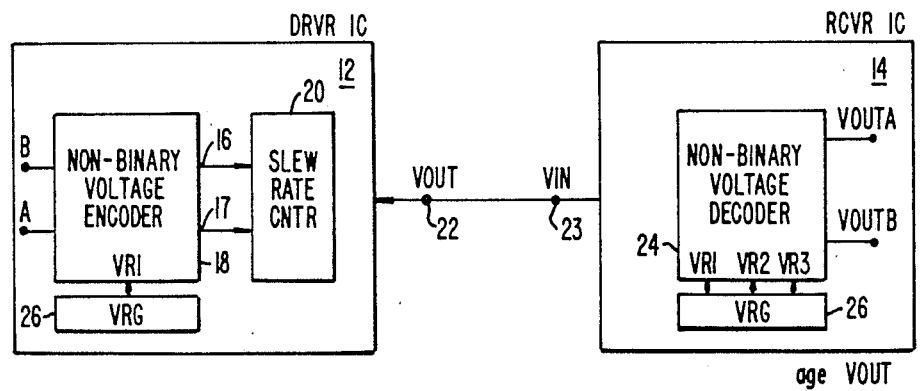
FIG._1.
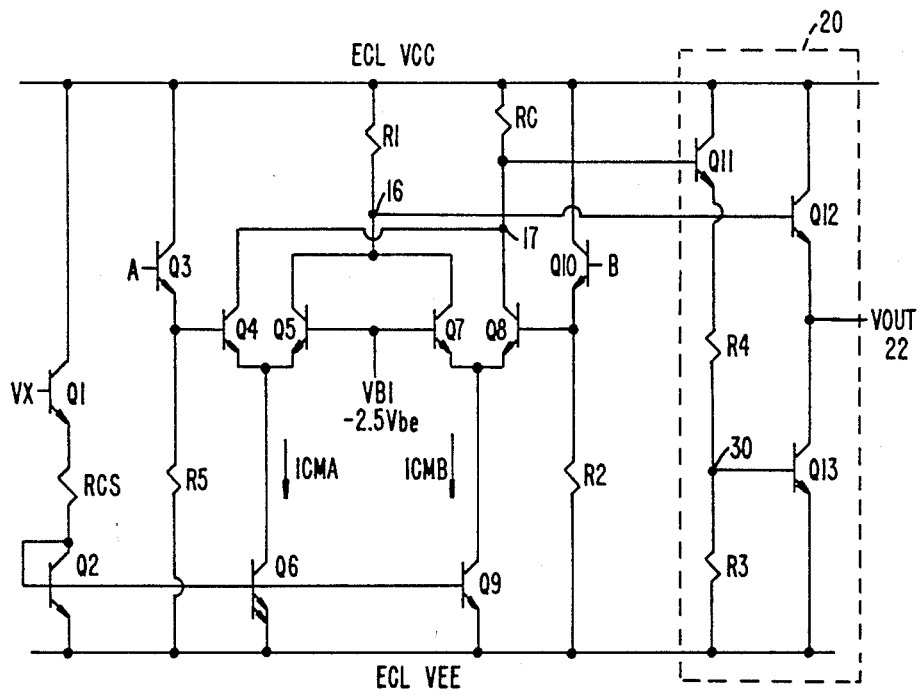
FIG._2.

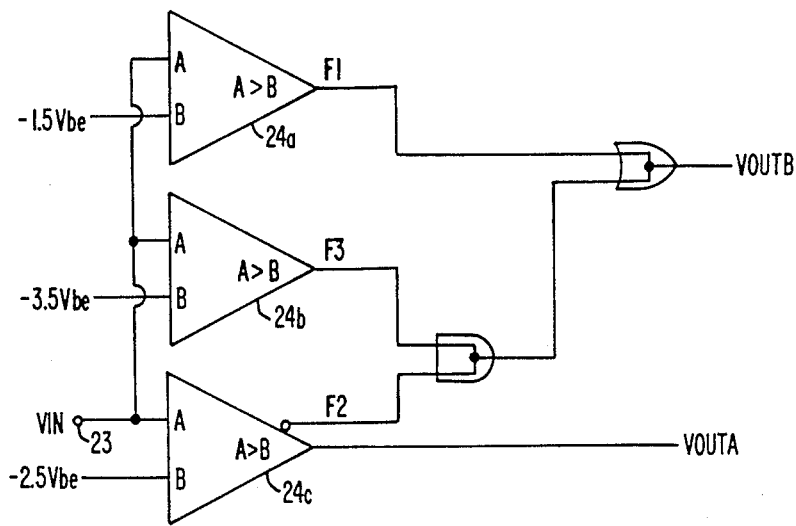
FIG._3.
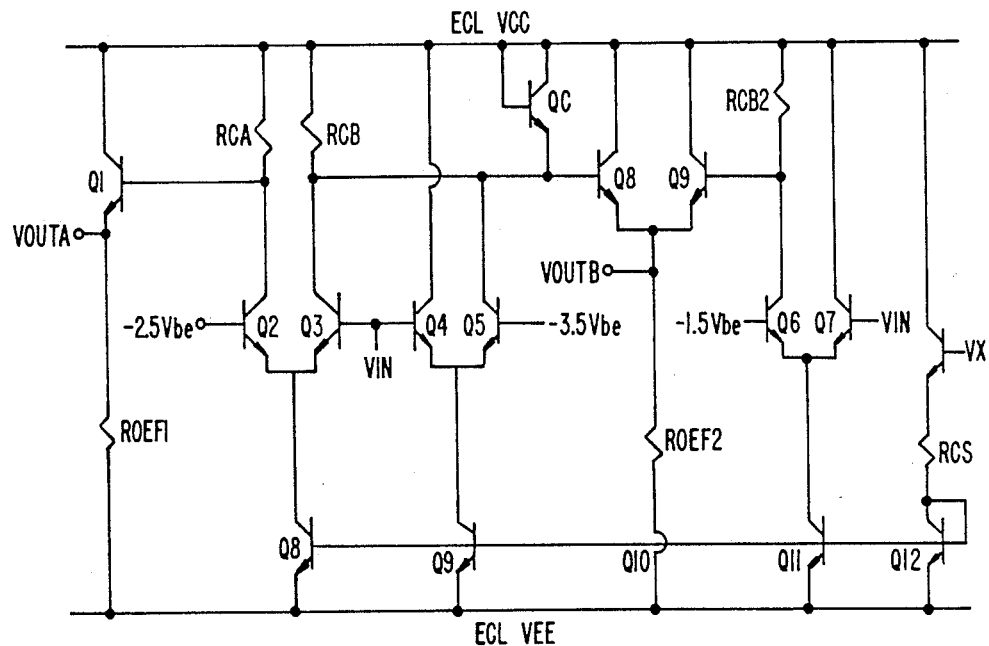
FIG._4.

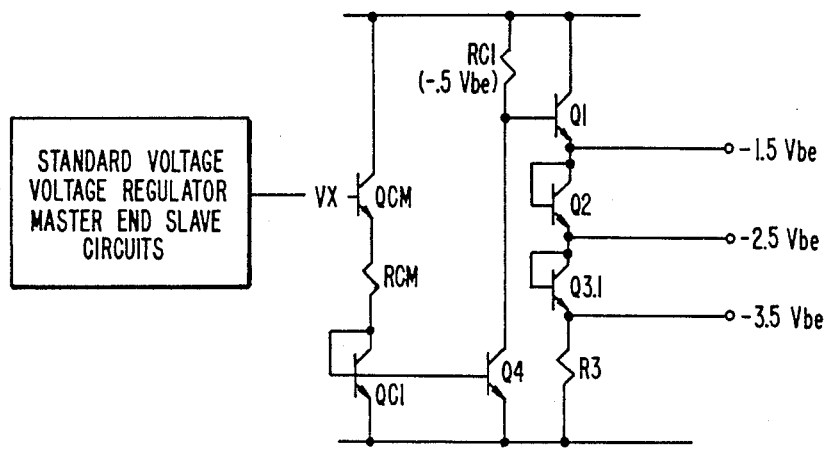
FIG._5A.
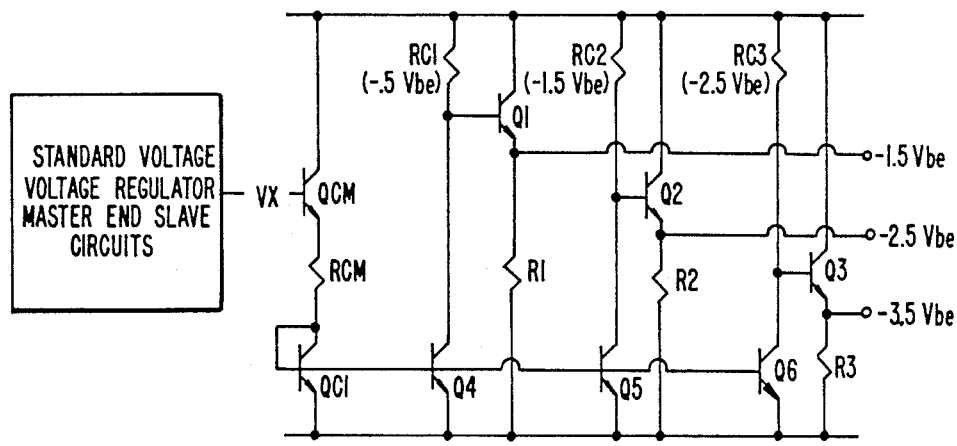
FIG._5B.

2:1 VOLTAGE MATRIX ENCODED I/O TRANSMISSION SYSTEM

BACKGROUND OF THE INVENTION

1. Field of the Invention

This invention relates to electronic circuits, and in particular to a voltage non-binary encoding and decoding circuit capable of transmitting and receiving multiple-level voltage signals on a single physical I/O pin.

2. Description of the Prior Art

Multiplexing circuits for encoding and decoding multiple binary signals are well known. Voltage-based multiplexing is capable of encoding N bits of data into one or more discrete voltage levels during a set time period. Conventional voltage multiplexing circuits require precharging of the output line and switching the precharged line to multiple logic levels corresponding to binary input states. Such a system is described in an article by Singh entitled "Four Valued Buses for Clocked CMOS VLSI Systems" published by the IEEE in 1987. The time required to precharge the output line reduces the encoding time period and thus the multiplexing speed of the conventional voltage multiplexing circuit.

The lack of speed of conventional voltage multiplexing methods allows only a limited number of bits of data to be transmitted and received on a single I/O pin. However, with recent increases in device density within an integrated circuit (IC), there is a need for greater number of bits of data to be multiplexed within a given time cycle. One of the major limitations of VLSI IC technology is the limited availability of I/O signal pads. I/O pad density on a VLSI IC or chip is directly proportional to the chip's peripheral dimensions. Although device density has increased drastically in recent years, I/O pad density has remained relatively constant. This causes most large scale digital designs to be I/O-constrained. Typically, a much larger number of I/O pads than are available are needed to effectively utilize the increased gate density. In order to effectively utilize the increase in device density, it is imperative that multiplexing schemes use the limited number of I/O pads to transmit as many binary bits of data as possible.

The actual data transmission rate for a given I/O pin depends on the number of discrete, non-binary encoded voltage levels and the delays incurred in the en-coding/decoding process. Thus, faster encoding/decoding circuitry is required to reduce the effects of the I/O bottleneck.

SUMMARY OF THE INVENTION

In the present invention, delays inherent in conventional decoders are avoided by novelly utilizing ECL-like circuitry, responsive to a pair of binary input signal, to develop discrete, non-binary encoded voltage levels at a pair of output nodes. These discrete voltage levels encode the binary values of the input signals and are output on a single pin.

According to one aspect of the invention, the input signals steer currents ICMA and ICMB through separate current trees including the two output nodes. The amplitude of ICMA is a selected multiple of the amplitude of ICMB.

According to another aspect of the invention, the amplitudes of ICMA and ICMB are controlled by transistors configured as a current mirror.

According to a further aspect of the invention, a decoder provides a true output in response to a received discrete encoded voltage level being in a defined voltage sub-interval of a predetermined voltage interval. Generally, the encoder encodes X received binary input signals onto one of $2^{**}X$ discrete voltage levels. This discrete voltage is transmitted to the decoder and converted to X binary output signals which correspond to the X binary input signals. The selection and encoding of X binary signals is effected simultaneously to reduce the delay incurred by the encoding/decoding process to a minimum during one clock cycle.

According to a still further aspect of the invention, two binary signals are decoded from one of four discrete voltage levels received by a single stage voltage interval decoder. The decoder receives three reference voltage levels to partition a voltage interval into four sub-intervals. The value of the first binary output signal is in a first state only if the encoded received discrete voltage interval is in the upper two sub-intervals. The value of the second binary output signal is in a first state only if the received discrete voltage level in the first or third voltage sub-interval. The decoding of the first and second binary output signals is concurrently performed by the novel decoding circuitry to reduce propagation delays. According to another aspect of the invention, the encoder includes a slew rate controller that provides an output driving capability that is proportional to the voltage delta between the prior discrete voltage level and the presently encoded discrete voltage level to minimize delay due to the loading effect of the output capacitance. In one embodiment, a unique ECL-like push-pull circuit is utilized to obtain this effect.

Other advantages and features of the invention will become apparent in view of the drawings and following detailed description.

BRIEF DESCRIPTION OF THE DRAWINGS

FIG. 1 is a block diagram of one embodiment of the present invention.

FIG. 2 is a circuit schematic diagram of the non-binary voltage encoder network.

FIG. 3 is a block diagram and logic diagram of the non-binary voltage decoder network of the present invention.

FIG. 4 circuit schematic diagram of the non-binary voltage decoder network.

FIG. 5a is a circuit schematic diagram of a conventional voltage reference generator.

FIG. 5b is a circuit schematic diagram of the voltage reference generator of the present invention.

DETAILED DESCRIPTION OF THE PREFERRED EMBODIMENT

FIG. 1 is a block diagram illustrating one embodiment of the present invention. In FIG. 1, a voltage encoded transmission system 10 includes both encoder 12 and decoder 14 systems. The encoder 12 of the present embodiment receives two binary input signals on two inputs pins A and B. The signals on the two binary input pins are converted to a single non-binary encoded voltage level on collector-ANDed output nodes 16 and 17 through use of a non-binary voltage encoder 18. These internal input pins, A and B, are virtual output pins relative to a physical VOUT pin 22.

A slew rate controller 20 receives the encoded, non-binary voltage levels on the collector-ANDed output nodes 16 and 17 and provides for rapid transitions between the discrete voltage levels at the VOUT pin 22.

The converted levels are transmitted from the single VOUT pin 22 to a VIN pin 23 at the decoder 14. The decoder 14 includes a non-binary voltage converter 24 for receiving and comparing the voltage levels received on a VIN pin 23 with externally supplied voltage references Vref1, Vref2, and Vref3. Voltage reference generator 26 supplies the non-binary voltage decoder 24, and the non-binary voltage encoder 18 with the necessary reference voltages, wherein each reference voltage is fixed at a separate and distinct voltage level. As the non-binary voltage decoder 24 receives each voltage level on the VIN pin 23, the respective level is compared with the three voltage references Vref1, Vref2, and Vref3 so that the comparison result corresponds to a high or low state on VOUTA and/or VOUTB output pins.

FIG. 2 is a circuit diagram of the non-binary voltage encoder 18. The operation of the circuit of FIG. 2 to effect voltage encoding will now be described. The values of the currents through the first collector-ANDed node 16 and the second node 17 will now be described for the four possible combinations of the binary A and B input values.

If A is low, the base of Q4 is at −3 Vbe which is less than −2.5 Vbe so that Q4 is off and Q5 is on. Therefore, current ICMA flows through R1; node 16, and Q5. Conversely, when A is high, the base of Q4 is at −2 Vbe, which is above −2.5 Vbe, so that Q4 is on and Q5 is off. Therefore, current ICMA flows through RC, node 17, and Q4. The results for B are analogous with ICMA replaced by ICMB.

If both A and B are low, the sum of ICMA and ICMB flows through node 16 and no current flows through node 17; if A is low and B is high. ICMA flows through node 16 and ICMB through node 17; if A is high and B is low. ICMA flows through node 17 and ICMB flows through node 16; and if A and B are both high ICMA and ICMB flow through node 17 and no current flows through node 16.

The voltage at node 16 is VCC less the voltage drop across R1 and the voltage at node 17 is VCC less the voltage drop across RC. From the above it is apparent that these voltage drops vary in opposite senses as the values of A and B change.

ICMA is given double ICMB current by using a proportional current mirror structure Q1, RCS, Q2, Q6, and Q9. Q1, RCS and Q2 ensure that the mirrored base voltages and currents on Q6 and Q9 are fixed and equal. Since transistor Q6 is double that of Q9, ICMA is always twice ICMB. Furthermore, the ICMB current value, as defined by the current mirror structure, is such that ICMB*R1=1 Vbe. Therefore, the discrete voltage levels on collector-ANDed output node 16 corresponds to 0, −1 Vbe, −2 Vbe, and −3 Vbe depending upon the combination of ICMA and/or ICMB flowing through R1, or not flowing through RC. The value of RC is selected so that the levels at node 17, for the same input states are −2.4 Vbe, −1.6 Vbe, −0.8 Vbe, and 0.

After the four distinct voltages at collector-ANDed output node 16 and 17 are generated, each distinct voltage level on node 16 must be established on the VOUT pin 22 with a minimum of delay to provide for high-speed operation.

This operation is accomplished by the slew rate controller 20 which includes transistors Q11, Q12, Q13 and resistors R4 and R3 depicted in FIG. 2. By buffering the voltages on collector-ANDed output nodes 16 and 17, the slew rate controller 20 ensures that the slew rates for each discrete voltage level delta on the VOUT pin 22 are proportional regardless of the high capacitive loads. This method provides a speed up to the VOUT pin 22 for larger voltage deltas.

The slew rate controller 20 of the present invention is unique and necessary to the high speed operation of the time-voltage encoding system. The slew rate controller 20 includes a pull-up transistor Q12 having its base connected to node 16, its collector connected to VCC, and its emitter coupled to VOUT 22 and a pull-down transistor Q13 having its collector coupled to VOUT 22 its base connected to a node 30, and its emitter coupled to VEE. Transistor Q11 has its base connected to node 17, its collector connected to VCC. and its emitter coupled to node 30 through resistor R4. Node 30 is connected to VEE via resistor R3.

The operation of the slew rate controller will now be described. Q11 and Q12 are emitter followers that follow the base voltage minus 1 Vbe. Thus, the output voltage on VOUT 22 is the voltage on node 16 minus 1 Vbe. From the above, these discrete quaternary encoded levels are −1 Vbe, −2 Vbe, −3 Vbe and −4 Vbe.

For a rising edge transition having a high positive delta. e.g., from −4 Vbe to −1 Vbe. Q12 functions as a level shift down and provides large pull-up drive current to the output load. Conventional output buffers usually have a resistor to VEE or a fixed current source as a termination. Thus, for a falling edge transition having a high delta. e.g., from −1 Vbe to −4 Vbe, only a small pull-down current is provided and the transition is very slow.

The operation of Q13, which is to provide a dynamic pull-down system that pulls down harder when a large falling edge transition occurs and pulls down less hard when a rising edge transition occurs, will now be described.

Q13 always supplies some pull-down current at the output so the voltage drop, V(3), across R3 is always equal to about the Vbe of Q13. Thus, the current through R3 is approximately constant. For a falling edge transition the base-voltage of Q11 rises and the base-voltage and emitter-voltage of Q12 falls. The increase of base voltage at Q11 causes a proportionally increased amount of current to flow through R4. Since the current through R3 is constant this increased current is directed into the base of Q13. This additional base current is further multiplied by the gain of Q13 and provides a large pull-down current which is proportional to the base-voltage of Q11.

Conversely for rising edge transitions the base-voltage of Q12 rises and the base and emitter voltage of Q11 falls. Thus more pull-up current and less pull-down current is required. The current through R4 decreases and base current of Q13 is reduced to lower the pull-down current at the output. The rise time delay at the output is reduced since charge up time depends on the difference between the emitter current at Q12 and the collector current at Q13. For large voltage deltas the magnitude of the current through R4 changes the most.

The greatest delay occurs for the largest voltage level transitions because more charge/discharge is required. Hence the slew rate control circuit 20 is adapted to provide more pull-down current for large falling transitions and less pull-down current for large rising transitions.

For intermediate transitions. e.g., from −1 Vbe to −2 Vbe, a lesser amount of pull-down current is provided because the required charge/discharge is less. Simulation studies have demonstrated a substantial delay reduction for large deltas.

Referring now to FIG. 3, a block diagram the non-binary voltage converter 24 depicts three dual input comparators 24a, 24b, and 24c, accompanied by logic hardware to convert a single input on VIN pin 23 to two binary outputs VOUTA and VOUTB. To activate VOUTA to a high output level, input signal voltage on VIN 23 must exceed Vref2 voltage of −2.5 Vbe. Otherwise, if the input voltage is less than −2.5 Vbe, then VOUTA will be low. To activate VOUTB, the input voltage must be less than Vref2 but greater than Vref3, or the input voltage must be greater than Vref1.

In this embodiment, Vref3=−3.5 Vbe, Vref2=−2.5 Vbe, and Vref1=−1.5 Vbe. VOUTA is activated if the input level exceeds Vref2 of −2.5 Vbe. Therefore, VOUTA will be high whenever the encoded input level equals −2 Vbe or −1 Vbe. VOUTB is activated if the input level is less than Vref2 but greater than Vref3, or when the input level exceeds Vref1. Therefore, VOUTB will be high whenever the input level equals −3 Vbe or −1 Vbe.

Referring now to FIG. 4, a circuit diagram of the non-binary voltage decoder 14 is illustrated. The decoder 14 comprises three comparator circuits having Vref1, Vref2, and Vref3 reference levels. Vref2 of −2.5 Vbe connects to the base of transistor Q2 of comparator 24c; Vref3 of −3.5 Vbe connects to the base of transistor Q5 of comparator 24b; and Vref1 of −1.5 Vbe connects to the base of transistor Q6 of comparator 24a. Each comparator receives an encoded input VIN which ranges in voltage between −1 Vbe to −4 Vbe. The input VIN is connected to the base of one of the two emitter coupled transistors in each comparator. The base of the other transistor connects to either Vref1, Vref2, or Vref3.

The two emitter coupled transistors of each comparator 24c, 24b, and 24a function as comparators by comparating the VIN signal on the base of one transistor to either the Vref1, Vref2, or Vref3 reference levels on the base of the other transistor. If, for example, VIN voltage is −1 Vbe, making it of higher voltage magnitude than Vref1, Vref2, and Vref3 references, then transistors Q3, Q4, and Q7 are on and conducting current and transistors Q2, Q5, and Q6 are effectively off. Since no current flows across RCA, collector voltage of transistor Q2 equals ECL VCC, causing VOUTA to a high level equalling −1 Vbe through Q1. RCB is fixed such that the current through Q3 causes base voltage of transistor Q8 to be −1 Vbe. However, because no current flows through RCB2, making the base voltage on Q9 equal to ECL VCC the wired-OR effect of Q8 and Q9 forces VBOUT equal to a high level or −1 Vbe since Q9 is on, even though Q8 is off.

If VIN is −2 Vbe, transistors Q3, Q4, and Q6 are on and transistors Q2, Q5, and Q7 are effectively off. Since no current flows across RCA, collector voltage of transistor Q2 equals ECL VCC causing VOUTA to a high level equalling −1 Vbe. The current through Q3 causes base voltage on transistor Q8 to be −1 Vbe, and the current through Q6 causes the base voltage on transistor Q9 to be −1 Vbe. Since the base voltages on both Q8 and Q9 are −1 Vbe, VOUTB is forced low at −2 Vbe.

If VIN is −3 Vbe, transistors Q2, Q4, and Q6 are on and transistors Q3, Q5, and Q7 are effectively off. The current through Q2 causes the base voltage of Q1 to be at −1 Vbe forcing VOUTA low at −2 Vbe. The current through Q6 causes the base voltage of Q9 to equal −1 Vbe. However, because negligible current flows through RCB, the base voltage of transistor Q8 equals ECL VCC. thus forcing VOUTB high at −1 Vbe.

If VIN is −4 Vbe, transistors Q2, Q5, and Q6 are on and conducting current and transistors Q3, Q4, and Q7 are effectively off. The current through Q2 causes the base voltage of transistor Q1 to be at −1 Vbe forcing VOUTA low at −2 Vbe. The current through Q6 causes the base voltage of Q9 equal to −1 Vbe. The current through Q5 causes the base voltage of Q8 to equal −1 Vbe. Since the base voltages on both Q8 and Q9 are at −1 Vbe, VOUTB is forced to a low level or −2 Vbe.

One unique capability of this decoder circuit is the ability to selectively isolate information relating to the state of the B input signal from the value of the discrete input signal. This value is determined by whether the nominal voltage range of −2.5 Vbe to −3.5 Vbe, or −3 Vbe. This circuit is faster, consumes less power, and has a lower device count than existing circuits.

Referring again to FIG. 4 it should be noted that in DC operation, either Q3 or Q5 may be on or off but both will not be on at the same time since VIN cannot be greater than −2.5 Vbe and less than −3.5 Vbe. If both devices were on, there would be an excess voltage drop across RCB and thus possibly saturating the current switch transistors Q3 and Q5. QC is added to insure than the collector voltages on Q3 and/or Q5 are clamped to acceptable levels by providing the necessary transient current during VIN transitions.

In FIG. 4 note that the lowest (most negative from VCC) input voltage, VIN, is −4 Vbe. Vref1, Vref2, and Vref3 are used to properly decode all four combinations of the A and B encoded signals from the discrete quaternary values of VIN. In particular, Vref3 is −3.5 Vbe from VCC. Thus, a current mirror scheme has been developed to insure nonsaturating operation of the current source. This allows the base voltage of the current mirror transistor to be +1 Vbe above VEE. Consequently, if Vbc of Q9 is 0.5 Vbe, than Vce(min) is 5.0 Vbe which is the diode stack requirement.

Knowing that Vbe is dependent upon temperature, ECL VEE minimum will, consequently vary as circuit temperature varies. However, even as circuit temperature varies drastically ECL VEE minimum of 5.0 Vbe ensures that the circuit will continue to operate normally. The following table demonstrates how ECL VEE min. varies as circuit temperature changes:

| Temp. (degrees C.) | Vbe (mV) | Delta Vbe/10x (mV) |
|---|---|---|
| −55 | 890 | 45 |
| 0 | 800 | 54 |
| 25 | 760 | 60 |
| 125 | 600 | 90 |

This circuit is therefore capable of proper high speed operation across the stringent 100K commercial specification which requires VEE to be between −4.2 V and −4.8 V and T, in degrees C, between 0 and 105. This is a significant advantage over other systems described in the literature which require a VEE(min) of −6.9 V.

FIG. 5a and 5b depict a conventional voltage reference generator and the voltage reference generator for use in the present invention respectively. Referring now to FIG. 5b, a circuit diagram illustrates the voltage reference generator 26 of the present invention. The −1.5 Vbe, −2.5 Vbe and −3.5 Vbe voltages used for Vref1, Vref2, and Vref3 respectively, requires a special voltage reference generator 26 depicted in FIG. 5b. The voltage reference generator 26 is unique in that it incorporates parallel connected transistors rather than series connected transistors. As illustrated in FIG. 5a, a conventional ECL voltage regulator operates by using successive diode drops across series coupled transistors Q1, Q2 and Q3. The voltage drop across each diode is dependent upon the temperature coefficients of each diode. The conventional diode-dividing scheme used to generate decode reference levels would be acceptable, and the decoder reference voltages will track the encoder reference voltages if (1) the encoder also uses a similar diode-dividing scheme, and (2) the encoder and decoder are subject to similar temperature conditions. However, when using multi-value voltage encoding of the present invention, a special ECL voltage regulator is required since the temperature behavior between the encoder and decoder does not track that of conventional ECL circuits. Thus multi-value voltage encoding achieves voltage division by weighing currents through a current switch. Since one emitter follower transistor (Q12) is employed in the encoder circuit 12, the temperature behavior of the encoded signal on VOUT/VIN pin 22 is a function of only one diode. Thus, the ECL voltage reference generator 26 of the present invention is used since the generated reference voltages are functions of only one diode as well. By placing the divider transistors in parallel rather than in series the reference voltages of the ECL voltage reference generator 26 are only dependent upon one diode: either Q1, Q2, or Q3.

The encoding assignment used in this system places restrictions on the inputs (A and B) if glitches at the output of the encoder or input of the decoder cannot be tolerated in the system. In this scheme, transitions on the B input (with A stable) of the encoder causes only 1 Vbe changes at the encoder output and does not glitch the A output of the decoder. Thus B transitions cannot glitch the decoding of A. For example if (AB)in=00, the encoder output is −4 Vbe and the decoder outputs are (AB)out=00 as desired. A transition for B from 0 to 1 causes (AB)in=01 and the encoder output changes from −4 Vbe to −3 Vbe. The decoder outputs are (AB)out=01. Thus (A)out is unaffected by the B transition.

Transitions for encoder input A however, can cause glitches to the decoding of B because transitions on the A encoder input cause 2 Vbe changes at the encoder output. Thus the decoder will glitch on the B output for transitions on the A input. For example, if (AB)in=0, the encoder output is −4 Vbe and the decoder outputs are (AB)out=0 as desired. If A changes to 1, then (AB)in=10 and the decoder output changes to −2 Vbe. When the encoder output is changing, it moves from −4 Vbe, −3 Vbe, and −2 Vbe. Thus the decoder output (AB)out moves from 00,01,10. Thus a transition in the encoder's A input glitches the B output of the decoder.

This interference can be avoided as long as the worst case timing of the B input is greater or equal to the worst case timing of the A input. This can be accomplished by restricting the arrival of the B input to be later than the A input thru computer aided design methods.

Although the preceding has been a description of the preferred embodiment in which specific circuitry have been provided, it should be appreciated that this information is intended to explain the invention and not to limit it. For example the VCC and VEE levels are described are standard to existing technology but are not required by the invention. Further, although a system having only two binary inputs has been described, the invention may be extended to systems having a greater number of inputs. Accordingly, the invention is not intended to be limited except as provided by the appended claims.

What is claimed is:

1. A non-binary voltage encoder for encoding X, X being an integer binary input signals into a corresponding one of 2**X discrete non-binary voltage levels, with the encoder being an ECL-type circuit for steering current between first and second voltage terminals, said encoder comprising:
   a first output node coupled to the first voltage terminal by a voltage generating circuit element;
   X ECL-type current trees, each having a first terminal connected to said first output node and responsive to an associated one of said X input binary signals, for, conducting an associated fixed amount of current only when the associated binary signal is in a first state so that the voltage level at said first output node is uniquely determined by the amount of current conducted by each current tree in response to the states of the X binary signals.

2. The invention of claim 1 further comprising:
   a second output node;
   X ECL-type complementary current trees, each having a first terminal connected to said second output node and responsive to an associated one of said X input binary signals, for conducting an associated fixed amount of current only when the associated binary signal is in a second state so that the voltage level at said second output node is uniquely determined by the amount of current conducted by each current tree in response to the states of the X binary signals and varies inversely to the voltage on said first output node.

3. The invention of claim 2 wherein:
   said first node is a first collector ANDed node coupled to the first voltage terminal by a first resistor;
   said second node is a second collector ANDed node coupled to the first voltage terminal by a second resistor;
   and wherein each ECL-type current tree comprises:
   an emitter-coupled comparator, having current inputs coupled to said first and second nodes and each having a current output coupled to the second voltage terminal through an associated current source providing an associated fixed magnitude of current, with each emitter-coupled comparator having a first logic input coupled to an associated one of said X binary signals and every emitter-coupled comparator having a second logical input tied to a reference voltage, and with each emitter-coupled comparator for steering its associated fixed amount of current through said first node if its associated binary signal is in a first state and through said second node if said associated binary signal is in a second state so that the value of the discrete voltage level on said first node uniquely encodes the binary values of said X binary signals.

4. The invention of claim 3 wherein the discrete voltage levels at said second node vary inversely as the discrete voltage levels at node 1 and further comprising:
a pull-up transistor having a first terminal coupled to the first voltage terminal, a base terminal coupled to said first node, and a second terminal coupled to an output port, said pull-up transistor for conducting current from the first voltage terminal to said output port;
a pull-down transistor having a first terminal coupled to said output port, a base terminal, and a second terminal coupled to the second voltage terminal, said pull-down transistor for conducting current from said output port to the second voltage terminal;
a pull-down control transistor having a first terminal coupled to the second voltage terminal, a base terminal coupled to said second node, and a second terminal coupled to said base terminal of said pull-down transistor via a current supply resistor; and
a control resistor coupling said base of said pull-down transistor and said current supply resistor to the second voltage terminal.

5. A non-binary voltage decoder comprising:
a voltage level generator for generating three ordered voltage levels, VR1, VR2, VR3, with VR3 being the most negative voltage level, to partition a predetermined voltage interval into four subintervals;
a first emitter-coupled comparator having a first logic input coupled to said input voltage signal and a second logic input coupled to VR1;
a second emitter-coupled comparator having a first logic input coupled to said input voltage signal and a second logic input coupled to VR2;
a third emitter-coupled comparator having a first logic input coupled to said input voltage signal and a second logic input coupled to VR3;
a first logic circuit, having an input coupled to said second comparator, for setting the value of a first decoded output signal to a first binary state only if the magnitude of said input voltage signal is greater than VR2;
a second logic circuit, having inputs coupled to said first, second, and third comparators, for setting the value of a second decoded output signal to said firsts binary state only if the magnitude of said input voltage signal is greater than VR1 or in the interval from VR2 to VR3.

* * * * *